United States Patent [19]

Grewal et al.

[11] 4,372,809
[45] Feb. 8, 1983

[54] METHOD FOR MANUFACTURING SOLDERABLE, TEMPERABLE, THIN FILM TRACKS WHICH DO NOT CONTAIN PRECIOUS METAL

[75] Inventors: Virinder Grewal, Ebersberg; Werner Reindl, Unterhaching, both of Fed. Rep. of Germany

[73] Assignee: Siemens Aktiengesellschaft, Berlin & Munich, Fed. Rep. of Germany

[21] Appl. No.: 346,100

[22] Filed: Feb. 5, 1982

[30] Foreign Application Priority Data

Mar. 2, 1981 [DE] Fed. Rep. of Germany ....... 3107943

[51] Int. Cl.³ .......................... C23F 1/02; B05D 5/12
[52] U.S. Cl. ................................... 156/656; 156/665; 204/192 R; 357/71; 427/90
[58] Field of Search ..................... 427/88–91; 357/71; 29/589–591; 204/192 C, 192 F, 192 R, 192 EC; 156/656, 659.1, 643, 665

[56] References Cited

U.S. PATENT DOCUMENTS 3,881,884  5/1975  Cook et al. .................. 29/591 X
4,132,813  1/1979  Schaal ............................ 427/90

OTHER PUBLICATIONS

IBM Technical Disclosure Bulletin, vol. 22, No. 10, Mar. 1980, Ceramic Shorted and Open Chips for Reliability Test of MC & MCp Substrates, Memis et al., p. 4474.

*Primary Examiner*—William A. Powell
*Attorney, Agent, or Firm*—Hill, Van Santen, Steadman, Chiara & Simpson

[57] ABSTRACT

A method for manufacturing solderable, temperable thin film tracks which do not contain precious metal on an electrically non-conductive substrate serving as a carrier employs the steps of applying an adhesive or resistance layer to the substrate, which serves as an intermediate layer, applying a conductive layer over the intermediate layer, and applying a protective anti-corrosion layer over the conductive layer. The protective layer may consist of aluminum or an aluminum alloy, or may be comprised of a combination of a layer of aluminum and a layer of chrome. An aluminum layer may also be applied between the intermediate layer and the conductive layer.

8 Claims, 4 Drawing Figures

METHOD FOR MANUFACTURING SOLDERABLE, TEMPERABLE, THIN FILM TRACKS WHICH DO NOT CONTAIN PRECIOUS METAL

BACKGROUND OF THE INVENTION

1. Field of the Invention

The present invention relates to methods for manufacturing solderable, temperable thin film tracks which are free of precious metal and which are applied to an electrically non-conducting substrate serving as a carrier in the form of an integrated film or hybrid circuit and wherein an adhesive layer is disposed between the conductive track layer and the substrate.

2. Description of the Prior Art

Conventional hybrid and integrated circuits are generally built upon an insulating substrate carrier comprised of, for example, ceramic, glass, glazed ceramic, synthetic or the like, all of which exhibit low surface roughness. Various electrical components such as resistors, capacitors, coils and conductor tracks are generated thereon according to various known methods from superimposed layers consisting of conductive material, resistance material, and/or non-conductive material as needed.

In an untempered state, tracks and contact locations comprised of copper can be easily soldered and have a better conductance than those consisting of combinations of precious metals, such as for example CuNiAu and PdAu. The adhesion of the copper layer on the substrate is, however, very poor. One solution to the problem of a lack of adhesion between the copper layer and the substrate is the application of a thin layer exhibiting good adhesion properties to the substrate carrier before application of the copper layer thereover.

In order to achieve solderable, mechanically stable and temperature resistant (up to 300° C.) track systems without the use of precious metal which exhibit a low resistance, such track systems have conventionally been generated according to known methods either with thick galvanically reinforced layers comprised of, for example, copper, or by tempering a thin conductive layer in a vacuum furnace or in a protective gas atmosphere. The thin conductive layers are applied to the insulating substrate by means of vapor-deposition or sputter-deposition in the vacuum and, depending upon the use to be made of the circuit, are reinforced or strengthened by means of electrochemical precipitation. The generation of the appropriate track structure is undertaken by vapor-deposition or sputter-deposition with the use of mechanical masks or by means of known photolithographic and etching processes.

In an untempered state, the copper conductive tracks retain the characteristic of being easily soldered. At higher temperatures, beginning at approximately 250° C., which occur in the stabilization of the resistance layers by temperature, a strong oxidation of the copper layer occurs. The layer of copper oxide which arises thereby does not prevent continuation of this oxidation process, and the relatively thick copper tracks in the range of, for example, 1 through 3 micrometers become throughly internally oxidized during the course of time and are no longer solderable.

SUMMARY OF THE INVENTION

It is an object of the present invention to provide a method for manufacturing thin film circuits with a track layer structure which does not contain precious metals which are easily solderable, are temperature-resistant even at temperatures above 300° C., are resistant to corrosion, exhibit low electrical resistance, and exhibit a high degree of bondability to the substrate.

The above object is inventively achieved in a method for manufacturing thin film tracks in which an additional antioxidation and anti-corrosion layer consisting of aluminum or an aluminum alloy is applied in the vacuum to the copper conductive layer. Copper layers which have already been vapor-deposited or sputter-deposited or which have been galvanically reinforced may be subsequently coated in the vacuum with such an anti-oxidation layer in accordance with the method disclosed herein.

The method disclosed herein has the advantage that, due to the elimination of precious metals, the manufacture of thin film circuits can be undertaken in a particularly economic manner. The field of thin film technology includes integrated hybrid circuits, resistance networks, RC networks and wirings for semiconductor chips, liquid crystal displays, plasma displays, and other known circuits and networks.

The method disclosed herein is of particular significance in conjunction with the manufacture of film circuits in which the temperature processes are carried out at temperatures greater than 300° C. and for those circuits which are operated at higher temperatures.

DESCRIPTION OF THE PREFERRED EMBODIMENTS

Figure 1:
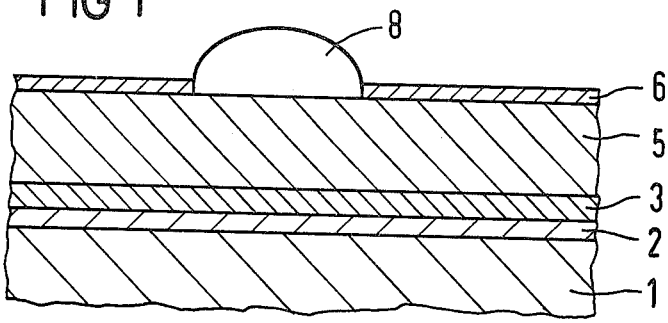
FIG. 1 is a sectional view of a thin film circuit constructed in accordance with the principles of the inventive method.

A sectional view of a portion of a thin film structure constructed in accordance with the principles of the present invention is shown in FIG. 1. The thin film structure is of a layer construction disposed on a substrate 1. The structure includes a resistance or resistance/capacitance layer which may be comprised of, for example, titanium, chrome, molybdenum, tungsten, titanium/tungsten, aluminum, nickel, nickel chrome, tantalum nitride, tantalum aluminum, tin indium oxide ($In_2O_3/SnO_2$) or the like. An adhesive layer 3 is disposed above the resistance layer 2 which may consist, for example, of titanium, chrome, aluminum and the like. A conductive layer 5 consisting of copper or a copper/nickel alloy is disposed above the adhesive layer 3. An anti-oxidation and anti-corrosion layer 6 consisting of aluminum or an aluminum alloy is disposed above the conductive layer 5. A solder location is referenced at 8.

Figure 2:
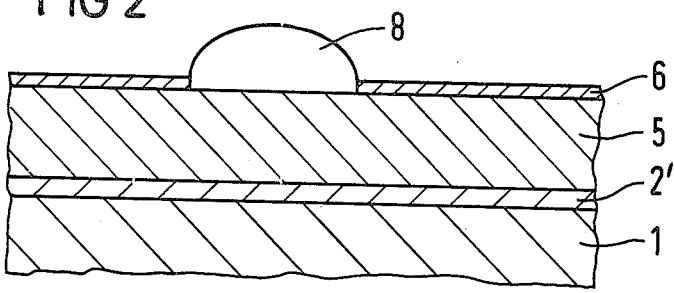
FIG. 2 is a sectional view of a further embodiment of the circuit shown in FIG. 1 with the resistance layer and adhesive layer combined into a single layer.
Figure 3:
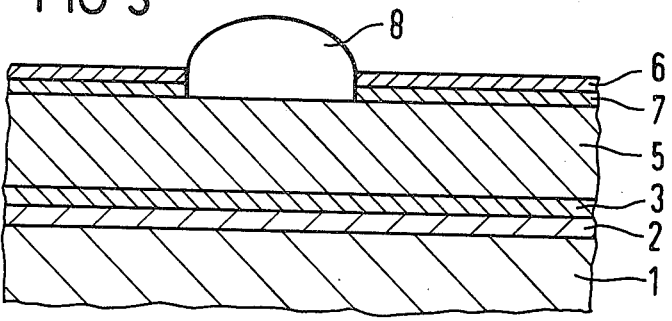
FIG. 3 is a sectional view wherein the protective layer consists of a layer combination of chrome and aluminum.
Figure 4:
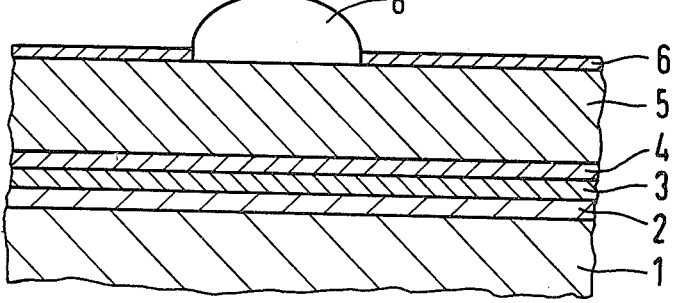
FIG. 4 is a sectional view of another embodiment of the device shown in FIG. 1 having an intermediate aluminum layer disposed between the adhesive layer and the conductive layer.

Various embodiments of the basic structure shown in FIG. 1 can be realized without departing from the inventive concept disclosed herein, as shown, for example in FIGS. 2, 3 and 4. In FIG. 2, the resistance and adhesive layers have been combined into a single layer 2' exhibiting both resistance and adhesive properties. In FIG. 3 separate resistance and adhesive layers 2 and 3 are again shown, however, the protective anti-oxidation and anti-corrosion layer is in this embodiment comprised of a layer of aluminum 6 and a layer of chrome 7 which function in combination to provide the desired anti-oxidation and anti-corrosion properties. In FIG. 4, an intermediate layer 4 comprised of aluminum is disposed between the conductive layer 5 and the adhesive layer 3.

During tempering, a mixture of copper and aluminum results at the boundary between the layers 5 and 6 as a result of intercrystalline diffusion. The anti-oxidation protection of the copper layer 5 during the tempering process ($\geq 300°$ C.) is guaranteed by the resulting aluminum oxide and aluminum/copper alloy layer. After the tempering processes, the anti-oxidation layer at the solder locations 8 is removed by various etching methods such as wet-chemical etching, ion beam etching, sputter etching and the like. The wetting of the solder locations with soldering material is excellent after the tempering. Interdiffusion of the adhesive and conductive layers during tempering improves the solderability of the upper layers.

The embodiment shown in FIGS. 1 through 4 can be realized with the following examplary layer thicknesses:
resistance layer 2: 5-200 nm
adhesive layer 3: 10-500 nm
intermediate layer 4: 10-500 nm
conductive layer 5: 300-5000 nm
protective layer 6: 10-500 nm
protective layer 7: 10-100 nm.

The track resistance of the overall structure shown in the embodiment of FIG. 4 comprised of a titanium resistance layer 2 which is 50 nm in thickness, an intermediate aluminum layer 4 which is 20 nm in thickness, a copper conductive layer which is 1500 nm in thickness and an aluminum protective layer 6 which is 20 nm in thickness is relatively low, having a value of 0.012 ohms/sq. After tempering at 400° C. for ½ hour in air, the resistance increased only to 0.014 ohm/sq.

Bonding tests on tempered circuits constructed in accordance with the principles of the present invention by means of ultrasonics shown that both the protective layers as well as the copper layer stripped of the protective layer are bondable with aluminum wires.

Although modifications and changes may be suggested by those skilled in the art it is the intention of the inventors to embody within the patent warranted hereon all changes and modifications as reasonably and properly come within the scope of their contribution to the art.

We claim as our invention:

1. A method for manufacturing solderable and temperable thin film conductor tracks with no precious metal on an electrically non-conducting substrate comprising the steps of:
applying a resistance layer to said substrate;
applying an adhesive layer over said resistance layer;
applying a conductive layer consisting of copper over said adhesive layer; and
applying an anti-oxidation and anti-corrosion layer consisting of aluminum or an aluminum alloy in vacuum to said adhesive layer and to said conductive layer.

2. The method of claim 1 wherein a single layer is applied to said substrate simultaneously serving as said resistance layer and said adhesive layer consisting of a material selected from the group consisting of nickel chrome, tantalum nitride, tantalum aluminum and tin indium oxide.

3. The method of claim 1 wherein said conductor layer consists of a copper nickel alloy.

4. The method of claim 1 wherein the step of applying said anti-oxidation and anti-corrosion layer is further defined by the steps of applying a layer of chrome over said conductive layer and applying a layer of aluminum over said layer of chrome, said aluminum layer and said chrome layer acting in combination as said anti-oxidation and anti-corrosion layer.

5. The method of claim 1 wherein said layers are applied in a vacuum by means of vapor deposition.

6. The method of claim 1 wherein said layers are applied in a vacuum by means of sputter deposition.

7. The method of claim 1 wherein said resistance layer, said adhesive layer, and said conductive layer are applied in a first vacuum process and wherein said protective layer is applied to said conductive layer in a separate vacuum process.

8. The method of claim 1 comprising the additional step of tempering said thin film conductor tracks and removing said anti-oxidation and anti-corrosion layer at selected locations by etching for subsequent soldering at said locations.

* * * * *